United States Patent
Wilson et al.

(10) Patent No.: US 7,826,292 B2
(45) Date of Patent: Nov. 2, 2010

(54) PRECHARGE CONTROL CIRCUITS AND METHODS FOR MEMORY HAVING BUFFERED WRITE COMMANDS

(75) Inventors: Alan J. Wilson, Boise, ID (US); Victor Wong, Boise, ID (US); Jeffrey P. Wright, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 92 days.

(21) Appl. No.: 12/266,376

(22) Filed: Nov. 6, 2008

(65) Prior Publication Data

US 2010/0110813 A1    May 6, 2010

(51) Int. Cl.
*G11C 7/00* (2006.01)
(52) U.S. Cl. ............ 365/203; 365/230.03; 365/189.16; 365/189.04; 365/230.06
(58) Field of Classification Search ................. 365/203, 365/230.03, 189.16, 189.04, 189.05, 189.08, 365/230.06
See application file for complete search history.

(56) References Cited

U.S. PATENT DOCUMENTS

2004/0120210 A1* 6/2004 Lee ........................... 365/232

\* cited by examiner

*Primary Examiner*—Thong Q Le
(74) *Attorney, Agent, or Firm*—Dorsey & Whitney LLP (57) ABSTRACT

Memories, precharge control circuits, methods of controlling, and methods of utilizing are disclosed, including precharge control circuits for a memory having at least one bank of memory. One such control circuit includes at least one precharge preprocessor circuit. The precharge preprocessor circuit is coupled to a respective bank of memory and is configured to prevent precharge of the respective bank of memory until after execution of buffered write commands issued to the respective bank of memory is completed.

25 Claims, 4 Drawing Sheets

Fig. 5

PRECHARGE CONTROL CIRCUITS AND METHODS FOR MEMORY HAVING BUFFERED WRITE COMMANDS

TECHNICAL FIELD

Embodiments of the present invention relate generally to semiconductor memory, and more specifically, to memory having additive latency and command reordering capabilities.

BACKGROUND OF THE INVENTION

A concept of "additive latency" (AL) has been introduced for the operation of memory systems to make command and data busses efficient for sustainable bandwidths. With additive latency commands may be issued to memory externally, but held by the memory internally prior to execution for the duration of AL in order to improve system scheduling. In particular, including AL can help avoid collision on the command bus and gaps in data input/output bursts.

Also as part of the AL concept, reordering of commands issued to the memory to improve scheduling has been considered. For example, in the event a write command to a bank of memory is issued to the memory prior to issuance of a read command to the same bank of memory, it may be more efficient to internally reorder the commands at the memory so that the read operation is performed before the write operation. Having AL for the read and write commands allows for the commands to be reordered and still meet timing specifications.

Already known is the concept of "precharging" a bank of memory following the completion of a read or write operation to the bank of memory. The precharge operation essentially "closes" the bank of memory, which must be later "opened" by an "activate" command before a subsequent read or write operation can be performed on the bank of memory. In order to precharge a bank of memory, a precharge command can be issued to a bank of memory, or a read or write command can be specified as having an "auto precharge" performed after the respective read or write operation to the bank of memory is completed.

Where a memory is capable of internally reordering commands it receives, managing precharge operations for a bank of memory must be given some consideration. Taking the previous example of having write and read commands internally reordered such that the read operation is performed prior to the write operation, performing a precharge of the bank of memory following the read operation (e.g., the read command is issued with an auto precharge) and before the write operation may negatively impact operational efficiency because the bank of memory will need to be opened again after it is closed by the auto precharge.

Therefore, there is a need for managing precharge operations for banks of memory in a memory having the ability to internally reorder commands issued to the memory.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
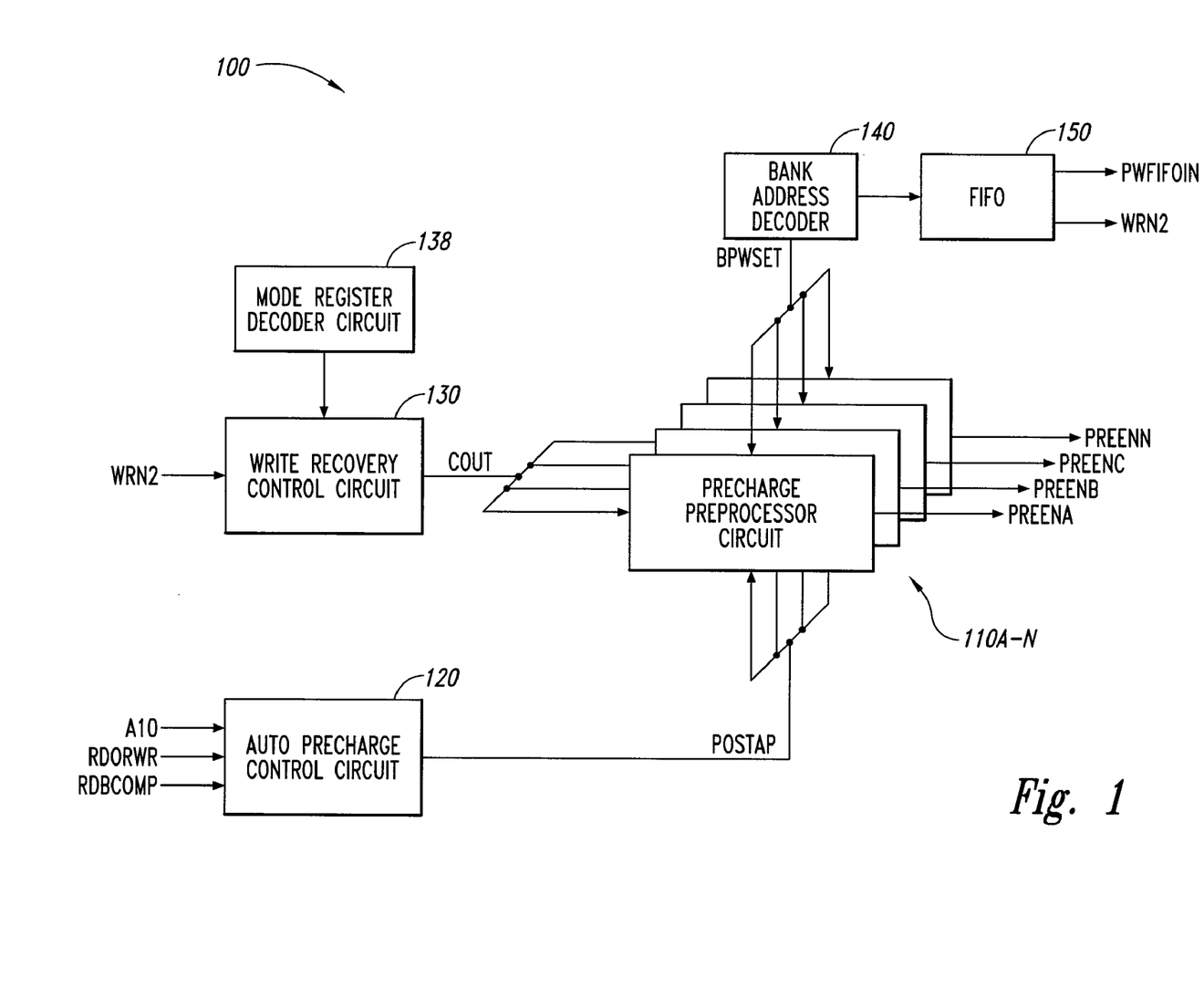
FIG. 1 is a block diagram of a posted write precharge control circuit according to an embodiment of the invention.

FIG. 1 illustrates a posted write precharge control circuit 100 according to an embodiment of the invention. The precharge control circuit 100 coordinates precharging of a bank of memory in a memory having posted write command capabilities. Memories having posted write command capabilities includes memories that can reorder internal write and read operations, for example, interrupting normal internal write operations to allow an internal read operation to be executed and completed before completing the internal write operation. As previously discussed, where a write command is issued to the memory prior to a read command, it may be more efficient to internally reorder the sequence of write and read command execution. Such memories may include buffers to which write commands are "posted" during the time internal read operations are performed.

Memories that have the ability to post write commands should be able to precharge banks of memory that have write commands posted and banks of memory that do not have any write commands posted at the right time in the event that a precharge command is issued to the particular bank of memory. As known, read commands and write commands may be issued with an auto precharge command, or a precharge command could be issued to a bank of memory during the time a write command is posted for the bank of memory. If a bank of memory has a write command posted, any precharge should be held until the write operation is completed. If the bank of memory does not have a write command posted, the bank of memory should be allowed to precharge as normal. That is, banks of memory that do not have any write commands posted should be allowed to be precharged without delay while banks of memory that have write commands posted should not be precharged until the proper time (i.e., after the last posted write operation for a bank of memory is completed).

To accomplish these operations, an address compare should be performed to determine which banks of memory have write commands posted and which banks of memory do not. The precharge control circuit 100 preprocesses the write commands and the bank addresses to prepare for a possible precharge command being issued while write commands are posted. As a result, all the compares are done up front before a precharge actually occurs, which can result in maintaining speed performance of the memory.

The precharge control circuit 100 includes precharge preprocessor circuits 110A-N for tracking posted write commands and precharge commands by memory bank and releasing the precharge for a bank upon completion of write operations (with sufficient write recovery time tWR) for that bank. As known, tWR is generally a minimum time or number of clock cycles following completion of a write operation before a precharge operation can occur. In the embodiment shown in FIG. 1, each precharge preprocessor circuit 110A-N is associated with a respective memory bank (not shown) of a memory. In one embodiment, the number of precharge preprocessor circuits 110 is eight, corresponding to eight banks of memory. In other embodiments, however, the number of precharge preprocessor circuits 110 can be lesser or greater than eight.

A bank address decoder 140 coupled to each of the precharge preprocessor circuits 110A-N receives and decodes bank addresses for write commands and activates the corresponding memory banks.

A posted write address first-in-first-out (FIFO) buffer 150 also receives the bank addresses for write commands (which are posted in a command buffer, not shown), which are loaded into locations of the FIFO 150. In response to loading an address for a write command, the posted write address FIFO 150 provides a pointer signal PWFIFOIN representing a bit combination that indicates the latest FIFO location to which the address for a posted write command is loaded. For example, assuming in one embodiment the posted write address FIFO 150 is five entries deep, and an address for a first posted write command is loaded into a first FIFO location, the posted write address FIFO 150 generates a PWFIFOIN pointer representing the bit combination of 00001. Upon loading an address for a second posted write operation into a second FIFO location, the posted write address FIFO 150 generates a PWFIFOIN pointer representing the bit combination of 00010.

The posted write address FIFO 150 further provides a pointer signal WRN2 representing a bit combination that indicates the latest FIFO location from which an address is released to execute a posted write command. For example, assuming the same five entry FIFO of the previous example, the posted write address FIFO 150 generates a WRN2 pointer representing the bit combination of 01000 when an address in the fourth FIFO location is released to execute the corresponding posted write command and generates a WRN2 pointer representing the bit combination of 10000 when an address in the fifth FIFO location is released to execute the corresponding posted write command.

The precharge control circuit 100 further includes an auto precharge control circuit 120 coupled to the precharge preprocessor circuits 110A-N. The auto precharge control circuit 120 manages auto precharge with read or write commands and provides an auto precharge request signal POSTAP to the precharge preprocessor circuit 110A-N associated with the bank of memory to which the precharge (and read or write command) is issued.

A write recovery control circuit 130 provides a precharge release signal COUT to the precharge preprocessor circuits 110A-N to indicate when a precharge operation for a bank of memory can be initiated. A mode register decoder circuit 138 coupled to the write recovery control circuit 130 decodes bits of a mode register (not shown) that set a write recovery time tWR that defines the minimum number of clock cycles following completion of a write operation before a precharge operation can occur. The timing of the COUT signal provides sufficient time for a write operation in a bank of memory to be completed and sufficient write recovery time to elapse before a precharge operation in the bank of memory can be initiated.

As previously discussed, the precharge control circuit 100 coordinates precharging of a bank of memory in a memory having posted write command capabilities. In operation, where a manual precharge command has been issued to a bank of memory that has a write command posted, the precharge control circuit 100 holds off the precharge until the write operation is completed and sufficient write recovery time has elapsed. If a precharge command is issued to a bank of memory that does not have a write command posted, the precharge control circuit 100 allows the precharge to occur without delay. Where a read command with auto precharge is issued to a bank of memory that has a write command posted, the precharge control circuit 100 holds off the precharge until any write operations are completed and sufficient write recovery time has elapsed. If a read command with auto precharge is issued to a memory bank that does not have a write command posted, the precharge control circuit 100 allows the precharge to occur immediately following completion of the read operation. Where a write command with auto precharge is issued to a bank of memory and is posted, the precharge control circuit 100 holds off the precharge until the write operation is completed and sufficient write recovery time has elapsed.

Figure 2:
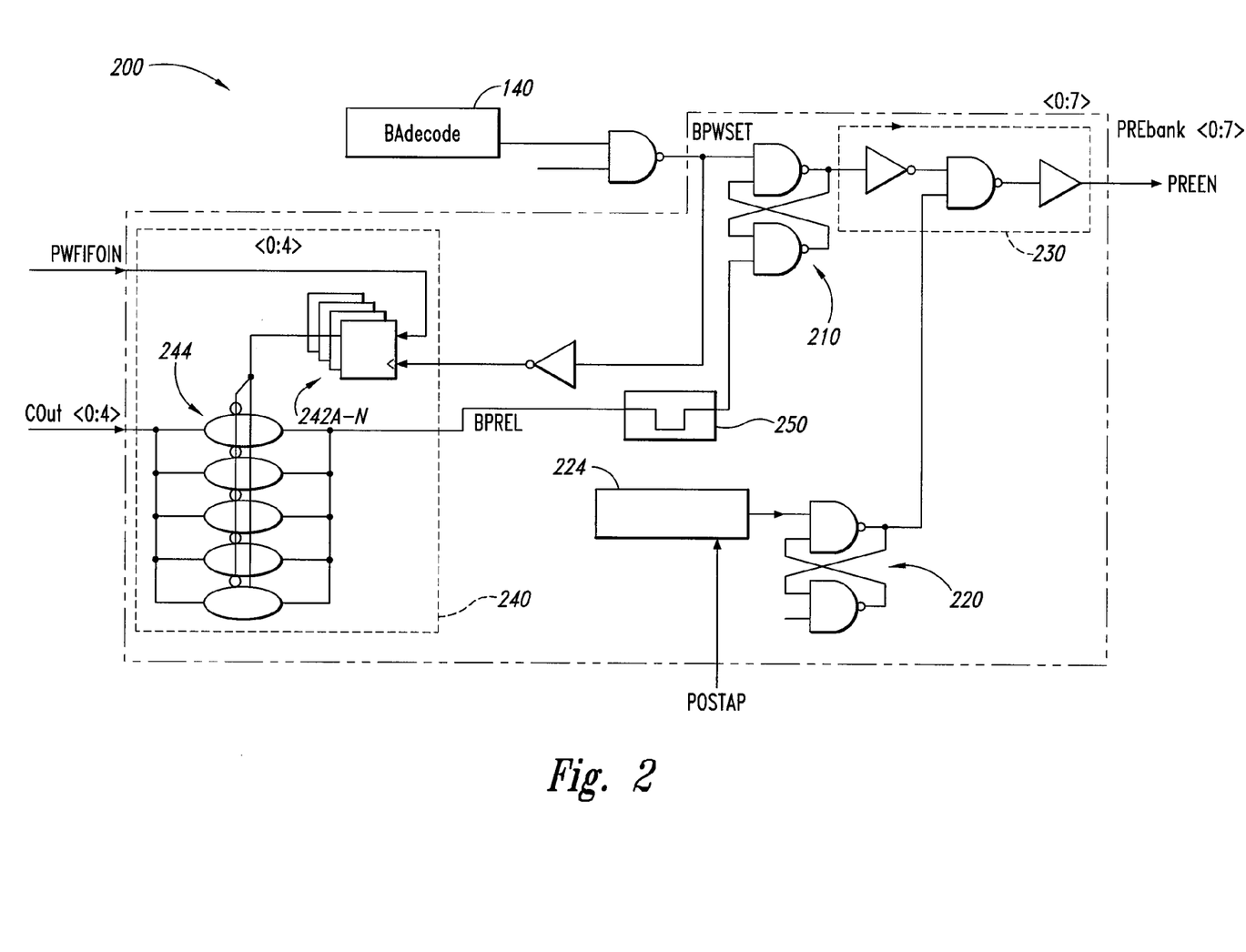
FIG. 2 is a block diagram of a precharge preprocessor according to an embodiment of the invention.

FIG. 2 illustrates a precharge preprocessor circuit 200 according to an embodiment of the invention. The precharge preprocessor circuit 200 can be used for each of the precharge preprocessor circuits 110A-N of FIG. 1. The precharge preprocessor circuit 200 includes a posted write latch 210 that is set by a bank specific posted write set signal BPWSET when the bank address decoder circuit 140 (FIG. 1) identifies a write command to be executed for the bank of memory associated with the particular precharge preprocessor circuit 200. The posted write latch 210 is reset when write commands posted for the respective bank of memory have been executed and a precharge operation (if requested) can be initiated. The precharge preprocessor circuit 200 further includes a precharge latch 220 that is set when a precharge command is to be executed for the bank of memory associated with the particular precharge preprocessor circuit 200 and reset when a precharge operation for the particular bank of memory is initiated. A manual precharge path 224 controls the setting of the precharge latch 220 in response to either a manual precharge command or an auto precharge command, which is indicated by the auto precharge command signal POSTAP provided by the auto precharge control circuit 120.

Output logic 230 receives an output from the posted write latch 210 and the precharge latch 220, and outputs a bank precharge enable signal PREEN to enable a precharge operation for the particular bank of memory when posted write commands issued to the bank of memory have been executed (as indicated by resetting of the posted write latch 210) and a precharge command is to be executed in the bank of memory (as indicated by the precharge latch 220 being set).

The precharge preprocessor circuit 200 further includes a precharge release circuit 240. The precharge release circuit 240 includes flip-flops 242A-N that receive the PWFIFOIN pointer from the posted write address FIFO 150 (FIG. 1) and which are clocked by the BPWSET signal to capture the current PWFIFOIN pointer when a write command has been issued for the particular bank of memory. In some embodiments, the number of flip-flops 242A-N corresponds to the depth of the posted write address FIFO 150. The captured PWFIFOIN pointer is used to control a multiplexer 244 that provides a bank posted precharge release signal BPREL to a pulse circuit 250 which generates a reset pulse for the posted write latch 210 when the BPREL signal is active. The BPREL signal is active when the bit combination of the COUT signal from the write recovery control circuit 130 has an active bit that corresponds to the multiplexer input that is coupled to the output. In some embodiments, this condition occurs when the WRN2 pointer provided to the write recovery control circuit 130 and output as the COUT signal to the precharge preprocessor circuit 200 after completion of the write operations and sufficient write recovery time has elapsed matches the PWFIFOIN pointer captured by the flip-flops 242A-N for a particular bank of memory. This condition represents when the last posted write command for the particular bank of memory is completed with sufficient write recovery time, and thus any precharge operation issued to the bank of memory can be initiated.

In summary, the precharge preprocessor circuit 200 does not initiate a precharge operation in a bank of memory until released by a COUT signal having a bit combination that when applied to the multiplexer 244 results in an active BPREL signal, which causes the pulse circuit 250 to generate a pulse to reset the posted write latch 210. This operation is illustrated by the following non-limiting example.

As previously discussed with reference to FIG. 1, a precharge preprocessor circuit is provided for each bank of memory. When an auto precharge command (from either a read or write command) is issued for a bank of memory having a write command posted, the precharge latch 220 of the precharge preprocessor circuit 200 of the bank of memory to which the write command is issued is set by a POSTAP signal from the auto precharge control circuit 120 that identifies the particular bank of memory. Similarly, a precharge command issued to a bank of memory having a write command posted also sets the precharge latch 220. Setting the precharge latch 220 results in HIGH logic level applied to one of the inputs of the NAND gate of the output logic 230. The output logic 230 will generate an active bank precharge enable signal PREEN under this condition only when the posted write latch 210 is in a reset state (i.e., the second input to the NAND gate of the output logic 230 is also HIGH). A reset state occurs when there are no write commands currently posted to the bank of memory, or as will be explained in more detail below, all posted write commands issued to the bank of memory have now been completed and sufficient write recovery time has elapsed.

When a write command to a bank of memory is posted, the corresponding bank address is decoded by the bank decoder circuit 140 and the posted write latch 210 of the precharge preprocessor circuit 200 corresponding to that bank is set by the BPWSET signal generated by the bank decoder circuit 140. As a result, one of the inputs to the NAND of the output logic 230 is at a LOW logic level, which holds any precharge operations for the bank of memory.

The bank address of the write command is also posted in the posted write address FIFO 150, which results in the FIFO generating a PWFIFOIN pointer indicating the location where the bank address is loaded. In the present example, it will be assumed the bank address is loaded into the third entry of a five-entry deep FIFO resulting in a PWFIFOIN pointer of 00100. Although the PWFIFOIN pointer 00100 is provided to all of the precharge preprocessor circuits 200. The PWFIFOIN pointer is latched by the flip-flops 242A-N of only the precharge preprocessor circuit 200 to which the posted write command is issued because it is the only precharge preprocessor circuit 200 to receive an active BPWSET signal from the bank decoder circuit 140, which is used to clock the flip-flops 242A-N.

The latched PWFIFOIN pointer 00100 is used to control the multiplexer 244 to couple a particular one of its inputs to the multiplexer output. In the present example, it will be assumed the latched PWFIFOIN pointer 00100 results in the third input of the multiplexer 244 to be coupled to its output. Under this condition, the pulse circuit 250 will output a reset pulse to the posted write latch 210 and release a precharge operation to the bank of memory only when a COUT signal of 00100 is provided by the write recovery control circuit 130 to the precharge preprocessor circuits 200. Although all of the precharge preprocessor circuits 200 receive the COUT signal, only the precharge preprocessor having its multiplexer 244 set to couple the third input to the multiplexer output will result in an active BPREL signal that causes the respective pulse circuit 250 to generate a reset pulse for the posted write latch 210.

As previously discussed, a COUT signal of 00100 will be output from the write recovery control circuit 130 in response to receiving a WRN2 pointer from the posted write address FIFO 150 corresponding to the location of the bank address of the write command for the bank of memory, that is, a WRN2 pointer of 00100. The WRN2 pointer is provided by the posted write address FIFO 150 when the bank address is released to initiate the corresponding write operation. In the present example, a WRN2 pointer 00100, which corresponds to the third-entry of the FIFO 150 where the bank address for the write command was loaded, is provided to the write recovery control circuit 130 when the bank address is released to initiate the write operation. Upon receiving the WRN2 pointer 00100, the write recovery control circuit 130 begins counting to provide sufficient time for the write operation to complete and sufficient write recovery time. The count number to which the write recovery control circuit 130 counts is generally determined by the internal timing for a memory access operation and the tWR value set in the mode register (not shown). When the count number is reached, a COUT signal 00100 is output to all of the precharge preprocessor circuits 200. As previously discussed, only the precharge preprocessor circuit for the bank of memory to which the write command was issued will result in an active BPREL signal that causes the pulse circuit 250 to generate a pulse that resets the respective posted write latch 210.

With the posted write latch 210 reset, any pending precharge operations (as indicated by the precharge latch 220 being set) will be released by the output logic 230 resulting in an active PREEN signal. The precharge latch 220 is reset upon initiation of the precharge operation for the bank.

The previously discussed embodiments and examples of the precharge preprocessor circuit are not intended to limit the scope of the invention. For example, the invention is not limited to having a posted write address FIFO 150 five entries deep or having eight banks of memory. Modifications to the previously described embodiments and examples can be made without departing from the scope of the invention.

Figure 3:
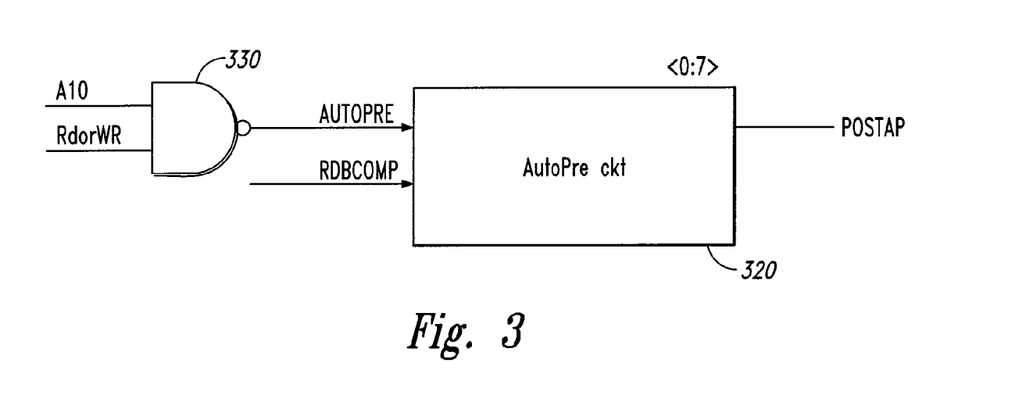
FIG. 3 is a block diagram of an auto precharge control circuit according to an embodiment of the invention.

FIG. 3 illustrates an auto precharge control circuit 300 according to an embodiment of the invention. The auto precharge control circuit 300 includes an auto precharge circuit 320 that receives an active auto precharge enable signal AUTOPRE from a logic gate 330 in response to a read or write command (RDORWR) having an auto precharge command (A10) and processes the auto precharge command to provide an auto precharge request signal POSTAP having bank specific information. Auto precharge commands with write commands are provided to the precharge path 224 of the respective precharge preprocessor circuit 110A-N (FIG. 1). In an embodiment using the precharge preprocessor circuit 200, the POSTAP signal sets the precharge latch 220 for the particular precharge preprocessor circuit 200, indicating a precharge has been commanded to the associated bank of memory and should be performed following the completion of the posted write operation in the bank of memory. Auto precharge commands with read commands are latched by the auto precharge control circuit 300 and are not provided to the respective precharge preprocessor circuit 110A-N of the particular bank of memory until an active read burst complete signal RDBCOMP, indicating completion of the read operation, is received.

Figure 4:
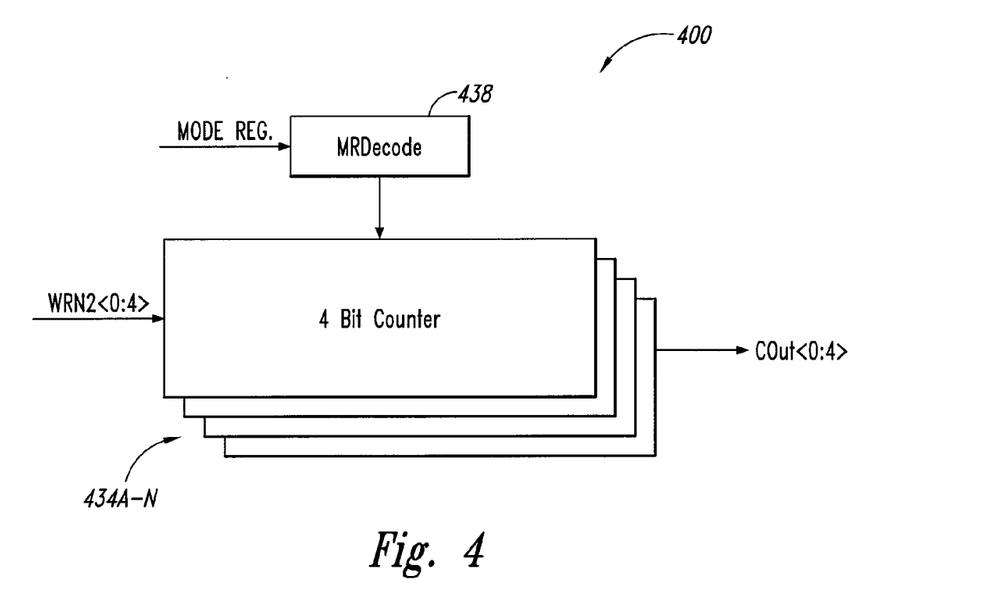
FIG. 4 is a block diagram of a write recovery control circuit according to an embodiment of the invention.

FIG. 4 illustrates a write recovery control circuit 400 according to an embodiment of the invention. The write recovery control circuit 130 (FIG. 1) can be implemented by the write recovery control circuit 400. The write recovery control circuit 400 includes counter circuits 434A-N coupled to the mode register decoder circuit 138. The mode register decoder circuit 138 decodes tWR information programmed in a mode register to provide the minimum write recovery time for write operations before a precharge operation can begin. The counter circuits 434A-N further receive the WRN2 pointer from the posted write address FIFO 150. In some embodiments, the number of counter circuits 434 corresponds to the number of bits of the WRN2 pointer. Each of the counter circuits 434 receives a respective bit of the WRN2 pointer. For example, with reference to a particular non-limiting example, where a WRN2 pointer has five bits, the number of counter circuits 434 would also be five with each receiving a respective bit of the WRN2 pointer. In response to receiving a respective bit of the WRN2 signal from the posted write address FIFO 150, the respective counter circuit 434 counts a number of clock cycles based on the write recovery time setting from the mode register decoder circuit 138 before outputting a respective bit of the precharge release signal COUT. The counter circuit 434 ensures that there is sufficient recovery time following a write operation to a bank of memory before initiating a precharge operation in that bank of memory.

Figure 5:
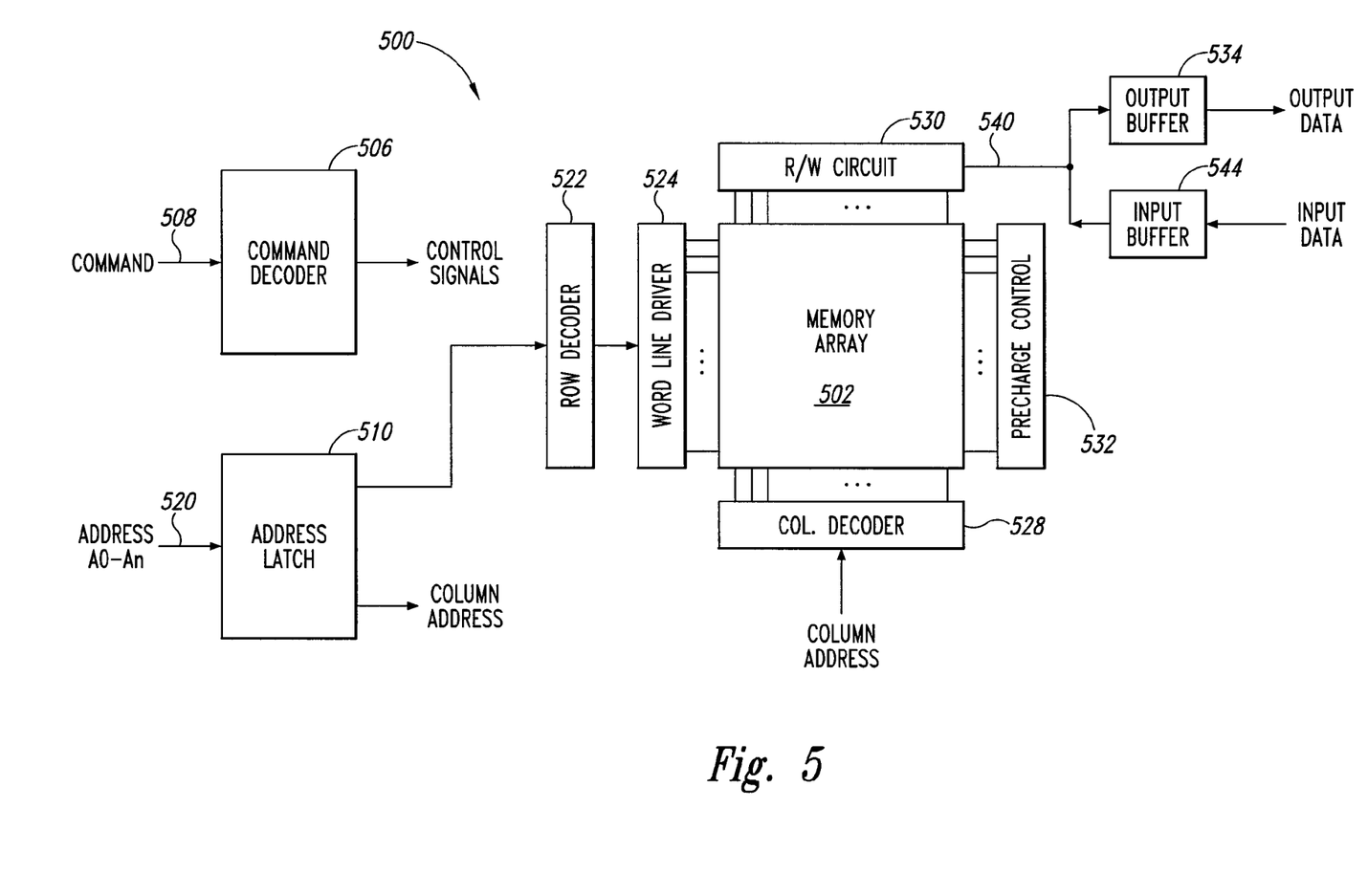
FIG. 5 is a block diagram of a memory having a posted write precharge control circuit according to an embodiment of the invention.

FIG. 5 illustrates a portion of a memory 500 according to an embodiment of the present invention. The memory 500 includes an array 502 of memory cells which are divided into banks of memory (not shown). The memory 500 includes a command decoder 506 that receives memory commands through a command bus 508 and generates corresponding control signals within the memory 500 to carry out various memory operations. The memory 500 further includes a posted write precharge control circuit 532 according to an embodiment of the invention. The precharge control circuit 532 is coupled to the banks of memory of the array 502, and as previously described, controls precharging of the banks of memory.

Row and column address signals are applied to the memory 500 through an address bus 520 and provided to an address latch 510. The address latch then outputs a separate column address and a separate row address. The row and column addresses are provided by the address latch 510 to a row address decoder 522 and a column address decoder 528, respectively. The column address decoder 528 selects bit lines extending through the array 502 corresponding to respective column addresses. The row address decoder 522 is connected to word line driver 524 that activates respective rows of memory cells in the array 502 corresponding to received row addresses. The selected data line (e.g., a bit line or bit lines) corresponding to a received column address are coupled to a read/write circuitry 530 to provide read data to a data output buffer 534 via an input-output data bus 540. Write data are applied to the memory array 502 through a data input buffer 544 and the memory array read/write circuitry 530. The command decoder 506 responds to memory commands applied to the command bus 508 to perform various operations on the memory array 502. In particular, the command decoder 506 is used to generate internal control signals to read data from and write data to the memory array 502.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A precharge control circuit for a memory having at least one bank of memory, the control circuit comprising:
   at least one precharge preprocessor circuit, each precharge preprocessor circuit coupled to a respective one of the at least one bank of memory, each precharge preprocessor circuit configured to prevent precharge of the respective bank of memory until after execution of buffered write commands issued to the respective bank of memory is complete.

2. The precharge control circuit of claim 1 wherein each of the precharge preprocessor circuits comprises:
   a first latch having a first state indicative of a write command issued to the respective bank of memory and a second state indicative of completion of the execution of write commands issued to the respective bank of memory;
   a precharge release circuit coupled to the first latch and configured to set the first latch to the second state in response to detecting completion of the execution of write commands issued to the respective bank of memory;
   a second latch having a first state indicative of a precharge command issued to the respective bank of memory and a second state indicative of no pending precharge commands; and
   output logic coupled to the first and second latches and configured to release a precharge enable signal in response to the first latch having the second state and the second latch having the first state.

3. The precharge control circuit of claim 2, further comprising a bank address decoder circuit coupled to each of the precharge preprocessor circuits and configured to decode bank address information of the buffered write commands and generate control signals to set the first latch of the precharge preprocessor circuit coupled to the bank of memory to which a write command is issued to the first state.

4. The precharge control circuit of claim 3 wherein the precharge release circuit comprises:
   a plurality of flip-flops coupled to the bank address decoder circuit and configured to latch a pointer in response to the control signal; and
   a multiplexer coupled to the plurality of flip-flops and coupled to the first latch, the multiplexer configured to couple one of a plurality of multiplexer inputs to a multiplexer output in accordance with the latched pointer.

5. The precharge control circuit of claim 4 wherein the multiplexer comprises a N:1 multiplexer and the plurality of flip-flops comprises N flip-flops.

6. A memory, comprising:
   a plurality of banks of memory;
   a bank address decoder configured to decode bank address information of posted write commands to determine the bank of memory to which each write command is issued;
   a write address buffer configured to store the bank address information of posted write commands;
   a write recovery control circuit coupled to the write address buffer and configured to generate precharge release signals indicating completion of the execution of a respective write command;
   a plurality of precharge preprocessor circuits coupled to the bank address decoder and the write recovery control circuit, each precharge preprocessor circuit coupled to a respective bank of memory and configured to hold execution of precharge commands for the respective bank of memory and initiate execution of precharge commands in response to precharge release signals corresponding to completion of a last posted write command for the respective bank of memory; and an auto precharge control circuit coupled to the plurality of precharge preprocessor circuits, the auto precharge control circuit configured to generate auto precharge request signals for the precharge preprocessor circuits to identify which banks of memory are to be precharged.

7. The memory of claim 6 wherein the write address buffer comprises a first-in-first-out (FIFO) buffer configured to generate an input pointer identifying a location in the buffer to which bank address information is stored and further configured to generate an output pointer identifying a location in the buffer from which bank address information is released.

8. The memory of claim 6 wherein the write recovery control circuit comprises a counter circuit configured to count to a predetermined number in response to the write address buffer releasing bank address information and generate the precharge release signals in response to counting to the predetermined number.

9. The memory of claim 8 wherein the predetermined number comprises a number providing sufficient time for a write command to be executed and sufficient write recovery time.

10. The memory of claim 6 wherein at least one of the precharge preprocessor circuits comprises:

a first latch coupled to the bank address decoder and the write recovery control circuit, the first latch set by the bank address decoder to a first state indicative of a write command issued to the respective bank of memory and set to a second state indicative of completion of the execution of write commands issued to the respective bank of memory;

a precharge release circuit coupled to the first latch and configured to set the first latch to the second state in response to the precharge release signal for the respective bank of memory;

a second latch having a first state indicative of a precharge command issued to the respective bank of memory and a second state indicative of no pending precharge commands; and output logic coupled to the first and second latches and configured to release a precharge enable signal in response to the first latch having the second state and the second latch having the first state.

11. The method of claim 10 wherein the precharge release circuit comprises:

a plurality of flip-flops coupled to the bank address decoder and configured to latch a pointer in response to the bank address decoder loading bank address information identifying the respective bank of memory; and a multiplexer coupled to the plurality of flip-flops and coupled to the first latch, the multiplexer configured to couple one of a plurality of multiplexer inputs to a multiplexer output in accordance with the latched pointer.

12. A method of precharging a memory having a plurality of banks of memory, the method comprising:

in response to receiving a manual precharge command for a bank of memory having at least one write command posted thereto, delaying execution of the precharge command for the bank of memory until after execution of posted write commands for the bank of memory is completed;

in response to receiving a manual precharge command for a bank of memory not having a write command posted thereto, executing the precharge command for the bank of memory without delay;

in response to receiving a read command with an auto precharge command for a bank of memory having at least one write command posted thereto, delaying execution of the precharge command for the bank of memory until after execution of the posted write commands for the bank of memory is completed;

in response to receiving a read command with an auto precharge command for a bank of memory not having a write command posted thereto, executing the precharge command for the bank of memory without delay following execution of the read command; and in response to receiving a write command with an auto precharge command for a bank of memory having at least the write command posted thereto, delaying execution of the precharge operation for the bank of memory until execution of the posted write commands for the bank of memory is completed.

13. The method of claim 12 wherein delaying execution of a precharge operation for a bank of memory until after execution of posted write commands for the bank of memory is completed comprises delaying execution of the precharge operation for the bank of memory until execution of the write command for the bank of memory is completed and sufficient write recovery time has elapsed.

14. The method of claim 12, further comprising executing a precharging command for another one of the banks of memory during delaying of a precharge command for a bank of memory having at least one write command posted thereto.

15. The method of claim 12, further comprising:

receiving a write command for a bank of memory prior to receiving a read command for the same;

buffering the write command for the bank of memory; and executing the read command for the bank of memory prior to executing the buffered write command for the same.

16. The method of claim 12, further comprising:

receiving a write command with an auto precharge command for a bank of memory; and preprocessing the write command prior to initiating execution of the auto precharge command.

17. The method of claim 16 wherein preprocessing the write command comprises:

decoding address information associated with the write command to identify a bank of memory to which the write command is issued; and setting an indicator that a precharge command is to be executed for the identified bank of memory.

18. A method for controlling precharge of a bank of memory to which a write command is issued, the method comprising:

buffering a write command issued to a bank of memory;

receiving a precharge command to the bank of memory to which the write command is issued while the write command is buffered;

preventing execution of the precharge command from beginning in the bank of memory until after execution of the write command is completed.

19. The method of claim 18 wherein receiving the precharge command comprises at least one of receiving a manual precharge command and receiving a memory command with an auto precharge command.

20. The method of claim 18 wherein preventing execution of the precharge command from beginning in the bank of memory until after execution of the write command is completed comprises:

holding a precharge enable signal generated in response to receiving the precharge command; and releasing the precharge enable signal after execution of the write command is completed to being execution of the precharge command.

21. The method of claim 20 wherein holding the precharge enable signal, comprises:

setting a first latch to indicate the write command was issued to the bank of memory; and setting a second latch to indicate a precharge command was issued to the bank of memory.

22. The method of claim 21 wherein releasing the precharge enable signal comprises resetting the first latch to indicate execution of the write command has completed.

23. The method of claim 20, further comprising:

capturing a buffered write pointer for a last buffered write command issued to the bank of memory, the buffered write pointer identifying a respective buffered write command;

in response to completing execution of a write command, generating a respective precharge release indicator indicative of the completed write command;

comparing the precharge release indicator and the buffered write pointer; and releasing the precharge enable signal for the bank of memory in response to the precharge release indicator and the buffered write pointer matching.

24. The method of claim 18 wherein preventing execution of the precharge command from beginning in the bank of memory until after execution of the write command is completed comprises preventing execution of the precharge command from beginning in the bank of memory until execution of the write command is completed and a write recovery time has elapsed.

25. The method of claim 24 wherein preventing execution of the precharge command from beginning in the bank of memory until execution of the write command is completed and a write recovery time has elapsed comprises counting a number of clock cycles after generating a buffered write pointer, the buffered write pointer identifying a respective buffered write command.

* * * * *